United States Patent
Matsubara et al.

[19]

[11] Patent Number: 5,877,543
[45] Date of Patent: Mar. 2, 1999

[54] DEVICE ASSEMBLY STRUCTURE WITH REINFORCED OUTER LEADS

[75] Inventors: Hiroshi Matsubara, Nara; Yasuhiro Sakamoto, Tenri, both of Japan

[73] Assignee: Sharp Kabushiki Kaisha, Osaka, Japan

[21] Appl. No.: 713,155

[22] Filed: Sep. 12, 1996

[30] Foreign Application Priority Data

Sep. 12, 1995 [JP] Japan ................................ 7-234137

[51] Int. Cl.⁶ .......................... H01L 23/495; H01L 23/48
[52] U.S. Cl. .......................... 257/674; 257/668; 257/779
[58] Field of Search .................................. 257/669, 674, 257/668, 779; 361/760

[56] References Cited

U.S. PATENT DOCUMENTS

| | | |
|---|---|---|
| 5,107,325 | 4/1992 | Nakayoshi . |
| 5,390,079 | 2/1995 | Aomori et al. ........................ 361/749 |
| 5,478,006 | 12/1995 | Taguchi .............................. 228/180.21 |
| 5,528,077 | 6/1996 | Tane et al. ............................. 257/666 |
| 5,659,198 | 8/1997 | Okutomo et al. ...................... 257/659 |

FOREIGN PATENT DOCUMENTS

| | | |
|---|---|---|
| A-4230330 | 3/1993 | Germany . |
| A-4429004 | 6/1995 | Germany . |
| 04199647 | 7/1992 | Japan . |

OTHER PUBLICATIONS

Translation of relevant parts of German Patent No. DE–A–4429004 listed as Reference BA on form PTO–1449 submitted Apr. 15, 1997.

E.H. Newcombe, III, "Design Tradeoffs When Using SMT, COB, And/Or Tab Packaging Technologies", Proceedings of The I.E.E.E., pp. 343–347, Sep. 28, 1992.

*Primary Examiner*—Teresa M. Arroyo
*Attorney, Agent, or Firm*—David G. Conlin; David D. Lowry

[57] ABSTRACT

A highly reliable assembly structure is provided by surely reducing a stress to be exerted on leads of a TCP device. Part of a soldered portion of outer leads that is located closer to a semiconductor chip of the TCP device is reinforced by a support ring formed on a side of the outer leads opposite from a circuit board, so that a stress to be exerted on the outer leads is dispersed to the leads, the support ring and solder to thereby prevent the possible occurrence of metal fatigue of the leads.

3 Claims, 6 Drawing Sheets

DEVICE ASSEMBLY STRUCTURE WITH REINFORCED OUTER LEADS

BACKGROUND OF THE INVENTION

1. Field of the Invention

The present invention relates to a device assembly structure, and in particular, to an assembly structure appropriate for assembling the outer leads of a tape carrier package device onto a circuit board.

2. Description of the Prior Art

In recent years, in order to cope with the reduction in size and weight of electronic equipments, semiconductor devices have been developed to have a high function and a large capacity. In accordance with this trend, semiconductor devices have been made to have a large size and an increased number of terminals, and a variety of methods for mounting such a device on a circuit board are under examination.

For example, an outer lead bonding method using a tape carrier package device (referred to as a TCP device hereinafter) has been put into practical use for the reason that the method is capable of mounting multi-terminal large-sized devices at a high density.

FIG. 17 is a sectional view showing a thinnest assembly structure for a prior art TCP device.

In FIG. 17, reference numeral 1 generally denotes a TCP device, and this TCP device 1 is provided with a semiconductor chip 11 covered with a protecting resin 15, leads 12 connected to the semiconductor chip 11 via a bump 13a and a support ring 14 for supporting the leads 12.

The leads 12 of the TCP device 1 are electrically and mechanically connected with electrodes 22 on a circuit board 20 by solder 31 with the semiconductor chip 11 received in a device hole 21 formed in the circuit board 20. In the figure, reference numerals 16 and 23 denote solder resists.

Generally, a portion 12a of the lead 12 which extends inwardly of the support ring 14 to be connected to the semiconductor chip 11 is referred to as an inner lead, while a portion 12b of the lead 12 which extends outwardly to be connected to the circuit board 20 is referred to as an outer lead.

In the assembly structure of this prior art, when the device 1 is mounted, the outer leads 12b are in a substantially straight state without being formed. By placing the semiconductor chip 11 in the device hole 21 formed in the circuit board 20, the device 1 does not protrude much above the circuit board 20, thereby allowing a thin assembly structure to be achieved.

In the prior art assembly structure in which no lead forming is performed, the outer leads 12b are extended straightly. This, however, has caused a problem that, when a temperature change occurs during a heat applying stage in the mounting process or during operation of the device which causes generation of heat, the leads 12 tend to be broken by a thermal stress attributed to a difference in coefficient of thermal expansion between the TCP device 1 and the circuit board 20. That is, the constituent members have their respective inherent coefficients of thermal expansion, and according to a change of environmental temperature, the members expand or contract at different coefficients of thermal expansion.

For example, in the assembly structure shown in FIG. 17, assuming that the coefficient of thermal expansion of the circuit board 20 is greater than the coefficient of thermal expansion of the TCP device 1, the circuit board 20 tends to expand more when the environmental temperature is increased. Consequently, in the TCP device 1, a tensional stress is generated in a direction in which the leads 12 extend. This stress causes a distortion in the TCP device 1. As shown in FIG. 18 which is an enlarged view of a section B in FIG. 17, the distortion occurs most frequently in a weakest portion of the outer lead 12b on the chip center side in the vicinity of a connection portion of the outer lead 12b with the solder 31 (the portion indicated by an arrow C) where the lead 12 is not reinforced by the support ring 14 nor by the protecting resin 15. Therefore, a metal fatigue occurs in the leads 12 due to a change of environmental temperature, and eventually the leads 12 will be broken. Particularly when the leads are fine, or very thin (when the connection pitch is small), the lead breakage occurs frequently.

In order to solve such a problem, a method for alleviating the stress by bending the leads as disclosed in the Japanese Patent Laid-Open Publication No. HEI 4-199647 has been proposed.

However, this method requires a region for bending the leads, and this causes a reduction of mounting density. Moreover, since the length of the lead itself increases, the lead tend to be deformed, consequently causing a problem that the lead connection at a fine pitch can be hardly achieved.

To solve the problem, a structure as shown in FIG. 19 can be considered in which after the bonding process of the outer lead 12b of a TCP device 101, the portion of the outer lead 12b that is not reinforced by the support ring 14 nor by the protecting resin 15 is coated with an insulating resin 18 for the purpose of reinforcement of the outer lead 12b.

The above structure, however, has the following problems.

That is, in soldering the outer lead 12b to the electrode 22 of the circuit board 20, a flux is generally used in order to remove oxide substances on the connection surfaces of the electrode 22 and the lead 12 to thereby assure a good connection. However, in view of the recent issue of regulating fluorocarbon materials due to environmental problems and for easy handling, non-cleaning type fluxes are often used.

Then, such a non-cleaning type flux leaves its residues at the connection portion and its periphery even after the soldering is achieved. Therefore, when the insulating resin 18 is applied on the outer leads 12b, spaces between the outer leads 12b and 12b and spaces between the outer leads 12b and the circuit board 20 are filled with the insulating resin 18 with the interposition of the flux residues, so that each outer lead 12b is fixed relative to the adjacent outer lead 12b and the circuit board 20 with the presence of the flux residues. However, the flux is not made such that it has a function of retaining an adhesion of the resin to the board and a function of reinforcing the connection portion. Therefore, the adhesion surface is readily peeled off by the stress. Also the flux itself tends to be damaged. Therefore, a sufficient reinforcing effect cannot be obtained by the fixation of the outer leads 12b with the insulating resin 18.

SUMMARY OF THE INVENTION

The present invention has been developed with a view to substantially solving the above described disadvantages and has for its essential object to provide a highly reliable device assembly structure by reducing the stress to be exerted on the leads of a TCP device.

In order to achieve the aforementioned object, the present invention provides a device assembly structure in which outer leads of a tape carrier package device are soldered to electrodes of a circuit board, wherein a support ring is formed on a side of the outer leads opposite from the circuit board, and part of a soldered portion of each outer lead is reinforced by the support ring, said part of the soldered portion being located closer to a semiconductor chip of the tape carrier package device than the other part of the soldered portion.

With the above arrangement, a stress to be exerted on the outer leads of the tape carrier package device is dispersed to the leads, the support ring and the solder, so that the possible occurrence of fatigue failure of the leads due to a thermal stress accompanying a change of environmental temperature in the mounting process can be prevented, and an assembly structure having a high reliability is achieved.

Furthermore, by virtue of the dispersion of the stress, there is no need to bend the outer leads for the alleviation of the thermal stress, so that the outer leads are allowed to have a minimum length for connection with the electrodes of a circuit board. This eventually allows the mounting density to be increased. Furthermore, by virtue of the reduction in length of the outer leads, the outer leads are subject to less deformation, and this eliminates the problem of displacement of the leads, thereby allowing the connection to be achieved at a fine pitch.

The device assembly structure of the present invention is appropriate for the mounting of a device provided with thin outer leads each having a cross-sectional area of $5.25 \times 10^{-3}$ mm$^2$ or less in a plane perpendicular to a direction in which the outer lead extends.

In an embodiment, in a position where the support ring does not exist, the adjacent outer leads are fixed to each other by a fixing material.

In this assembly structure, the outer leads are reinforced not only by the support ring but also by the fixing material. Therefore, a stress to be exerted on the outer leads is dispersed to the fixing material as well. Furthermore, because the adjacent outer leads are fixed to each other by the fixing material, the outer leads in a lead group are prevented from coming apart. As a result, displacement of the outer leads is avoided, and connection of the outer leads with the electrodes at a fine pitch is assured.

Preferably, the fixing material is made of an insulating resin material, such as polyimide based resin.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Preferred embodiments of the present invention will be described in detail below with reference to the accompanying drawings.

First embodiment

Figure 1:
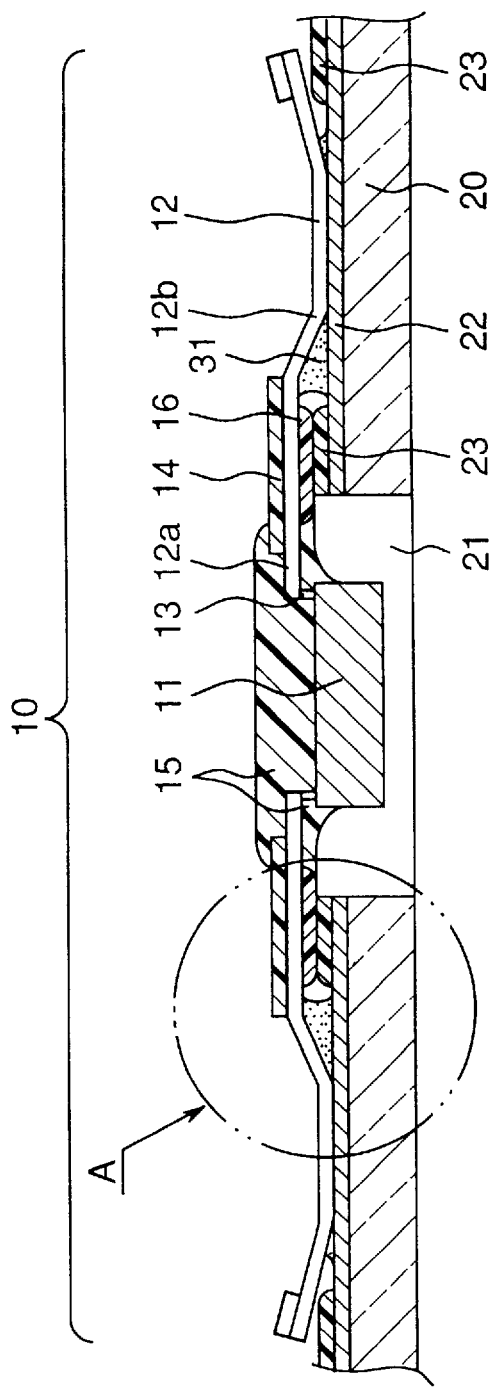
FIG. 1 is a sectional view of a device assembly structure according to a first embodiment of the present invention.

FIG. 1 is a sectional view of an assembly structure according to a first embodiment of the present invention, where portions corresponding to those of the aforementioned prior art are denoted by the same reference numerals.

Although the outer leads 12b are illustrated in a bent form in FIG. 1 and other figures described later, this is attributed to the thickness of a solder resist 23 on a circuit board 20 and the thickness of a tape solder resist 16. In general, the thicknesses are very small in comparison with the length of the leads 12, however, the solder resist 23 and the solder resist 16 are depicted through exaggeration of their thicknesses for the sake of convenience in explaining the figures. In the practical connection, the deformation of the outer leads 12b is very small and the connection is achieved substantially straightly.

A TCP device 10 in the present embodiment is provided with a semiconductor chip 11 covered with a protecting resin 15, leads 12 connected to the semiconductor chip 11 via a bump 13 and a support ring 14 for supporting the leads 12.

In this TCP device 10, an electrode 22 on the circuit board 20 and the outer lead 12b of the TCP device 10 are electrically and mechanically connected with each other with solder 31 with the semiconductor chip 11 placed in a device hole 21 formed in the circuit board 20.

The support ring 14 of the TCP device 10 is normally made of a polyimide resin having a thickness of 75 $\mu$m to 125 $\mu$m, and it is bonded to the leads 12 by epoxy resin or the like (not shown).

The lead 12 is normally made of Cu, and the solder 31 which connects the lead 12 to the electrode 22 is normally made of an alloy of Pb and Sn.

The support ring 14 of the TCP device 10 is provided on the side of the leads 12 opposite from the surface to which the semiconductor chip 11 is connected.

The circuit board 20 is implemented by, for example, a glass-epoxy substrate, and the electrodes 22 are formed on the circuit board 20. The electrodes 22 are achieved by Au/Ni/Cu multi-layer wiring.

According to the assembly structure of the present embodiment, the TCP device 10 is mounted on the circuit board 20 without forming the outer leads 12b such that the outer leads 12b extend substantially straight. Therefore, a thermal stress attributed to a difference in coefficient of thermal expansion between the TCP device 10 and the circuit board 20 is exerted on the leads 12. So, in order to reduce the thermal stress and thereby achieve a highly reliable assembly structure, the following structure is provided.

That is, according to the present embodiment, the outer leads 12b of the TCP device 10 are reinforced by the support ring 14 formed on the side of the outer leads 12b opposite from the circuit board 20.

Figure 2:
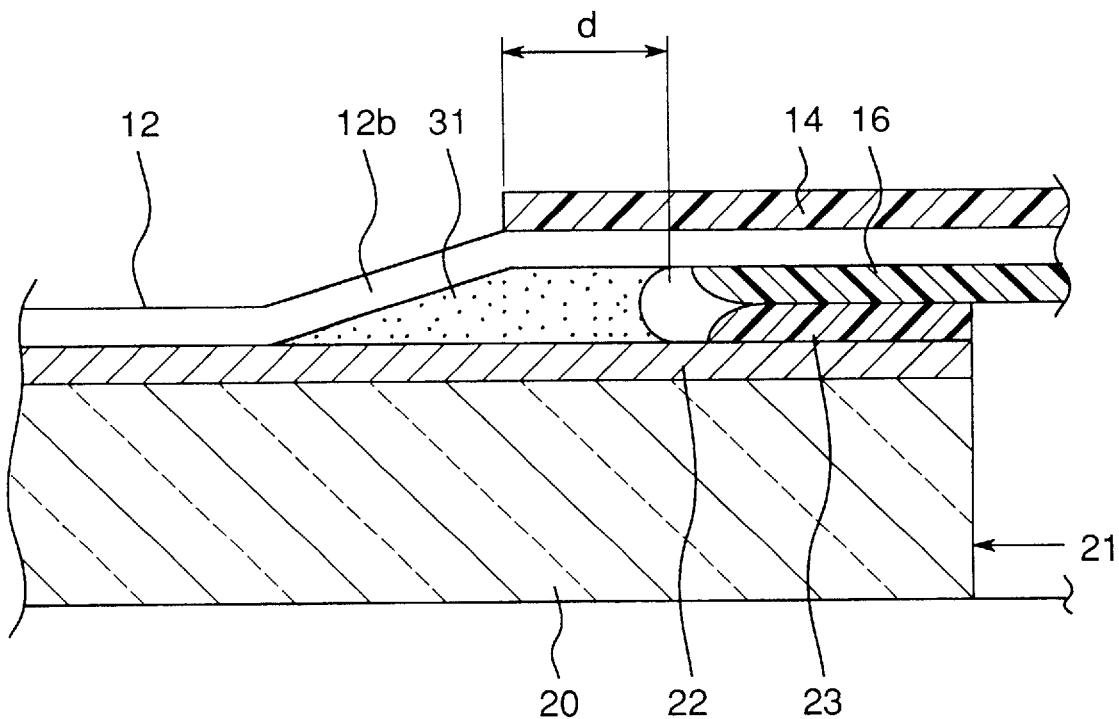
FIG. 2 is an enlarged sectional view of a section A of FIG. 1.

FIG. 2 is an enlarged sectional view of the section A of FIG. 1 showing the state of reinforcement.

As shown in FIG. 2, the outer leads 12b are connected with the corresponding electrodes 22 of the circuit board 20 with the solder 31 present therebetween in a region immediately outside of the solder resists 16 and 23, and a portion (indicated by a reference character d in FIG. 2) located closer to the semiconductor chip 11 of the soldered portion of the outer lead 12b has a structure reinforced by the support ring 14.

With the above arrangement, the thermal stress to be exerted on the leads 12 due to a change of environmental temperature or the like occurring in the mounting process can be dispersed to the leads 12, the support ring 14 and the solder 31. As a result, the strength of the soldered portion of the outer leads 12b remarkably increases.

Furthermore, there is no need to bend the outer leads 12b for the alleviation of the thermal stress. This allows the outer leads 12b to have a minimum length required for connection. This eventually increases the mounting density. Furthermore, by virtue of the reduction in length of the outer leads 12b, the leads 12 are less deformed, and this eliminates the problem of displacement of the leads 12, thereby allowing the connection to be achieved at a fine pitch.

The present invention is especially effective in connecting fine outer leads. That is, in the case of the prior art assembly structure as shown in FIG. 17 wherein it is assumed that materials used are the same as those used in the present embodiment, when the Cu outer leads 12b each have a width of as narrow as 0.15 mm or less and a thickness of as thin as 0.035 mm or less (i.e., each outer lead has a cross-sectional area of $5.25 \times 10^{-3}$ mm$^2$ in a plane perpendicular to the direction in which the outer lead 12b extends), the breakage of the outer leads 12b occurs after 1000 cycles of a cooling and heating cycle test of $-55°$ C. (30 minutes) and $125°$ C. (30 minutes). When the outer lead is thicker (although the total cross-sectional area of the outer leads is same), however, the strength of the lead itself is great enough to hardly cause the breakage due to fatigue failure. Therefore, in the latter case, there is little need to adopt the present invention.

In contrast, the present invention is effective when applied to the case where each outer lead 12b has a cross-sectional area of not greater than $5.25 \times 10^{-3}$ mm$^2$. More specifically, when mounting, for example, a TCP device having outer leads of a width of 0.06 mm and a thickness of 0.03 mm to a circuit board, by bonding the support ring to an outer lead and making a bonded portion of the support ring used for reinforcement of the outer lead have an area of $1.8 \times 10^{-2}$ mm$^2$, no breakage of the outer lead took place in the same cooling and heating cycle test as above, proving the effect of the present invention.

In the above embodiment, the leads 12 are made of Cu. The leads may be covered at need with one or more layers of a metal or metals such as Ni, Au, Cu, or an alloy of Pb and Sn. Furthermore, the solder 31 which connects the leads 12 with the electrodes 22 is not limited to the alloy of Pb and Sn, and it is acceptable to use a metal of Sn, Pb, In, Sb, Zn, Ag, Bi or the like singly or an alloy of them. The circuit board 20 can be made of, for example, paper/phenol, ceramic, polyimide, glass or the like, instead of glass/epoxy, and the electrodes 22 on the circuit board 20 can be implemented by a wiring containing a metal which has an affinity to solder at least on its surface (solderable metal), e.g., a Cu wiring or a multilayer wiring such as Au/Cu/W or (alloy of Pb and Sn)/Au/Ni/Cu.

The mounting process of the present embodiment will be described next.

Figure 3:
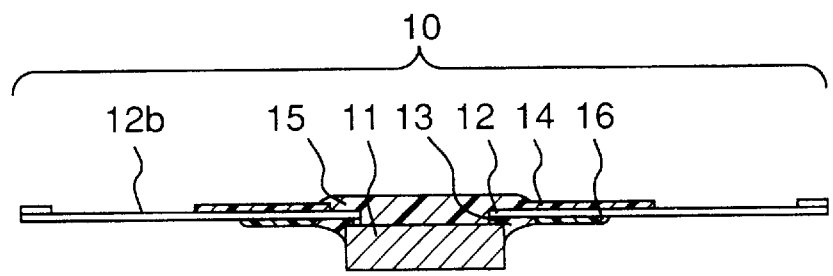
FIG. 3 is a sectional view of a TCP device shown in FIG. 1.
Figure 4:
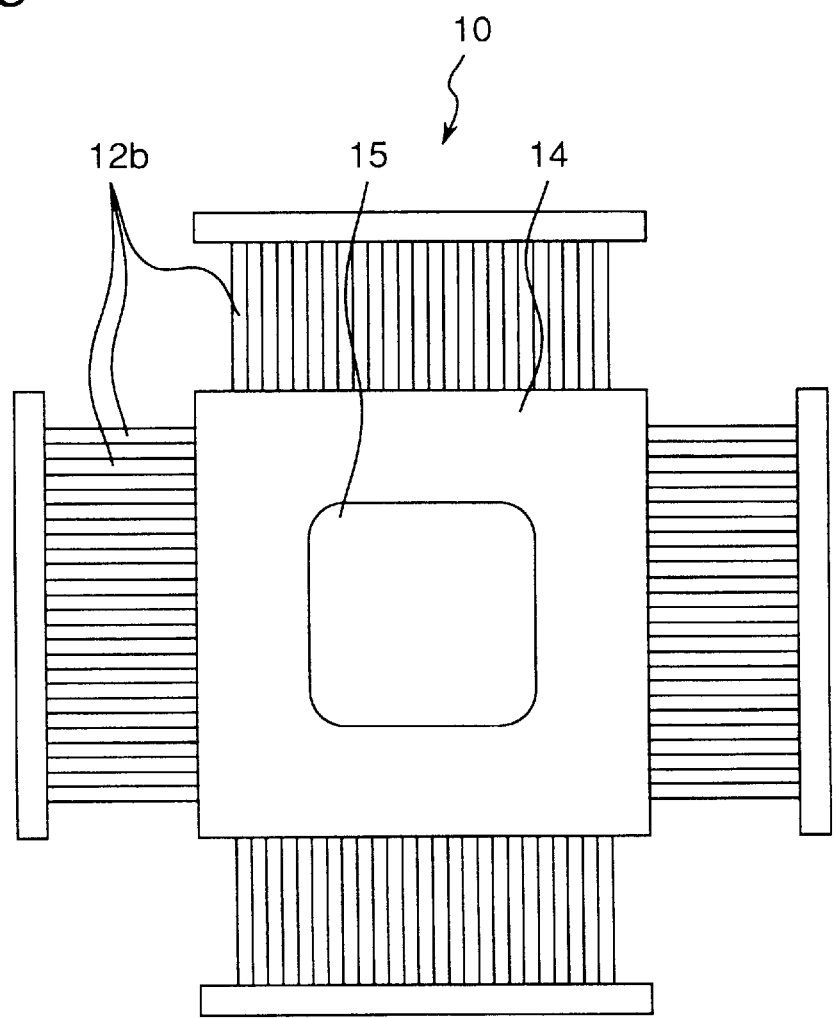
FIG. 4 is a plan view of the TCP device shown in FIG. 3.

First, a TCP device 10 as shown in FIGS. 3 and 4 is prepared. The TCP device 10 has a support ring 14 located above the leads 12 when the active surface of the semiconductor chip 11 is viewed as an upper surface, as shown in FIG. 3. Thereafter, outer leads 12b of the TCP device 10 are aligned with the electrodes 22 of the circuit board 20 having the device hole 21, as shown in FIG. 1, and the outer leads and the electrodes are mutually connected with solder using a heating means such as a pulse heat tool.

In the above stage, a solder layer is formed on the electrodes 22 of the circuit board 20 and/or the outer leads 12b of the TCP device 10. Further, auxiliary means for improving the connectability such as the use of flux can be adopted at need. Further, to supply solder, known techniques such as electrolytic plating, electroless plating or solder paste printing can be used. In this way, the assembly structure shown in FIG. 1 can be obtained.

Soldering conditions and other conditions in the mounting process will be described in more detail below with reference to FIG. 5.

Figure 5:
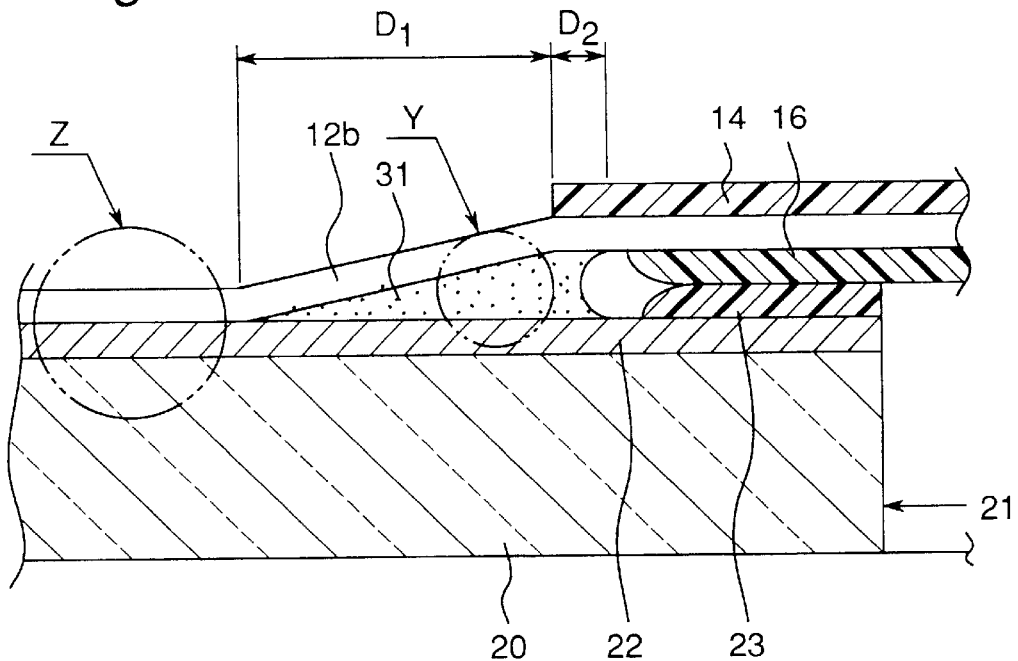
FIG. 5 is an enlarged sectional view for explaining an assembling process of the embodiment shown in FIG. 1.

In the mounting process, by supplying the solder 31 to the electrodes 22 of the circuit board 20 and/or the outer leads 12b and heating an area Z shown in FIG. 5 with a pulse heat tool with a pressure applied, the solder 31 is melted up to the portion Y located closer to the semiconductor chip 11 (refer to FIG. 1). In this stage, by increasing the temperature of the circuit board 20, the solder 31 is easily fused sufficiently to the depth of the portion Y.

It is to be noted that conditions such as a temperature $t_1$ of the portion Z, a temperature $t_2$ of the circuit board 20, distances $D_1$ and $D_2$ shown in FIG. 5, an amount of solder 31, depend on the size of the leads 12 and can be experimentally selected so as to produce the intended effect. Particularly when the above distance $D_1$ is short, there is fear that the support ring 14 will be peeled off by the heat applied to the portion Z.

Second embodiment

Figure 6:
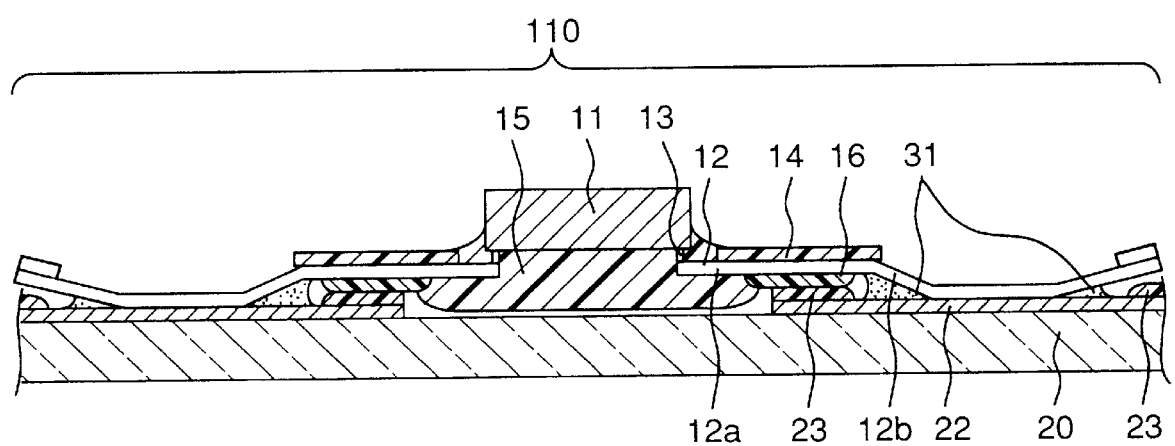
FIG. 6 is a sectional view of a second embodiment of the present invention.
Figure 7:
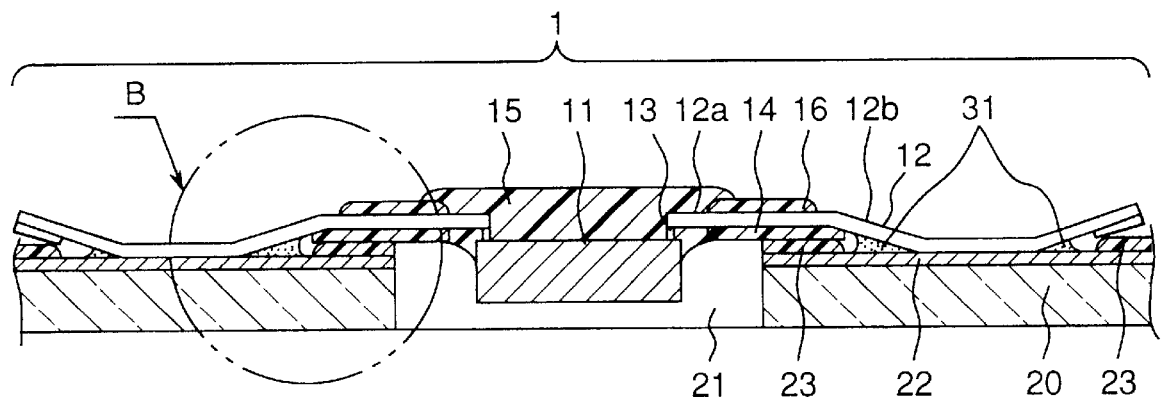
FIG. 7 is a sectional view of a prior art assembly structure.
Figure 8:
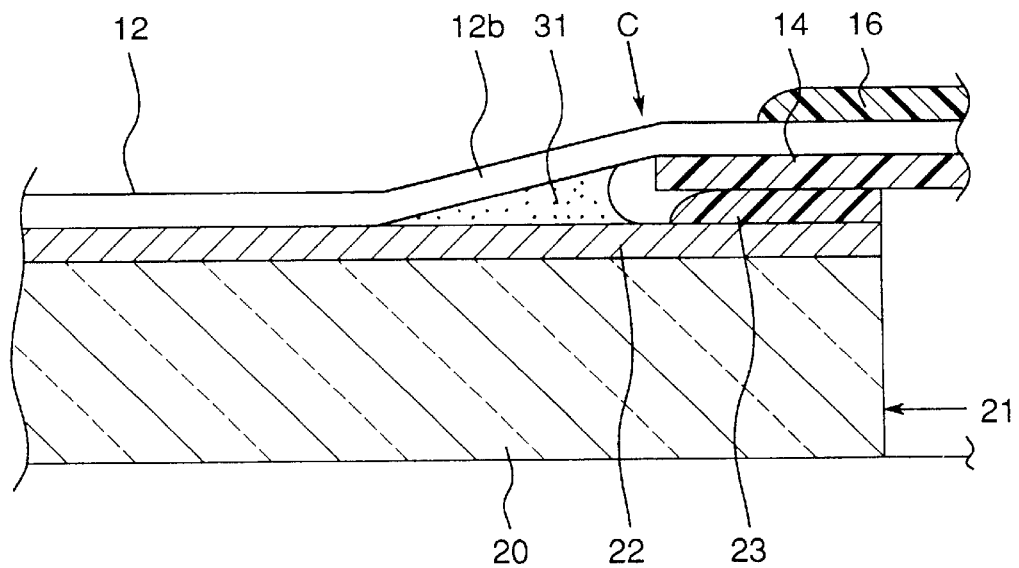
FIG. 8 is an enlarged sectional view of the section B of FIG. 7.
Figure 9:
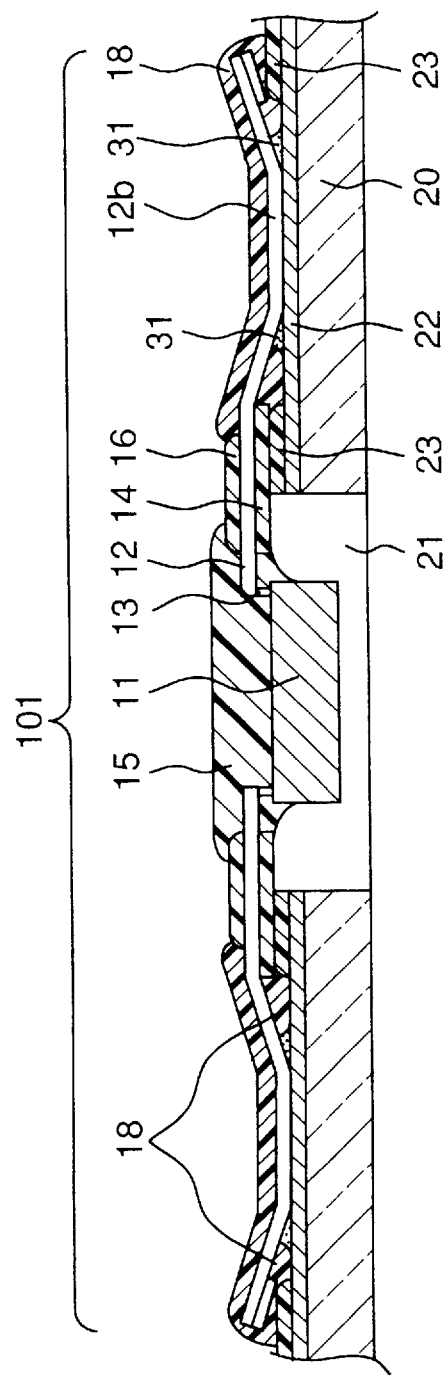
FIG. 9 is a sectional view of a background art assembly structure.

FIG. 6 is a sectional view of a second embodiment of the present invention, where portions corresponding to those of the first embodiment are denoted by the same reference numerals.

In the second embodiment, the semiconductor chip 11 is connected with its active surface opposed to the circuit board 20, i.e., in the face-down fashion. In this case, the device hole 21 of the circuit board 20 is unnecessary. Unlike the first embodiment, a TCP device 110 of the second embodiment is such that the support ring 14 is located under the lead 12 when the active surface of the semiconductor chip 11 is viewed as an upper surface. The construction of the TCP device 110 of the second embodiment is the same as that of the TCP device 10 of the first embodiment in the other respects.

Also, a soldered connection portion of each outer lead 12b in this embodiment has the same construction as that of the outer lead 12b in the first embodiment. That is, the outer leads 12b are reinforced by a support ring 14 formed on the side of the outer leads 12b opposite from the circuit board 20.

With the above arrangement, a thermal stress to be exerted on the leads 12 due to a change of the environmental temperature is dispersed to the support ring 14 and the solder 31, which allows the strength of the connection portions to increase remarkably.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device assembly structure in which outer leads of a tape carrier package device are soldered to electrodes of a circuit board, wherein a support ring is formed on a side of the outer leads opposite from the circuit board, and an outer peripheral portion of said support ring is superimposed on part of a soldered portion of each outer lead such that said part of the soldered portion is reinforced by the support ring, said part of the soldered portion being located closer to a semiconductor chip of the tape carrier package device than the other part of the soldered portion.

2. A device assembly structure as claimed in claim 1, wherein the outer leads extend substantially straight.

3. A device assembly structure in which outer leads of a tape carrier package device are soldered to electrodes of a circuit board, wherein a support ring is formed on a side of the outer leads opposite from the circuit board, and part of a soldered portion of each outer lead is reinforced by the support ring, said part of the soldered portion being located closer to a semiconductor chip of the tape carrier package device than the other part of the soldered portion, and wherein each outer lead has a cross-sectional area of $5.25 \times 10^{-3}$ mm$^2$ or less in a plane perpendicular to a direction in which the outer lead extends.

* * * * *